United States Patent
Byeon et al.

(10) Patent No.: US 8,760,181 B2
(45) Date of Patent: Jun. 24, 2014

(54) SEMICONDUCTOR SYSTEM AND DEVICE FOR IDENTIFYING STACKED CHIPS AND METHOD THEREOF

(75) Inventors: Sang-Jin Byeon, Gyeonggi-do (KR); Jong-Chern Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 637 days.

(21) Appl. No.: 12/914,424

(22) Filed: Oct. 28, 2010

(65) Prior Publication Data

US 2012/0007624 A1 Jan. 12, 2012

(30) Foreign Application Priority Data

Jul. 7, 2010 (KR) ........................ 10-2010-0065435

(51) Int. Cl.
*G01R 31/36* (2006.01)
*G11C 5/02* (2006.01)

(52) U.S. Cl.
USPC ...................................... 324/750.15; 365/51

(58) Field of Classification Search
CPC ....................... H01L 25/00; H01L 2223/54433
USPC ......... 324/750.15, 762.06, 750.3; 428/14–18; 702/108–126; 257/48
See application file for complete search history.

(56) References Cited

U.S. PATENT DOCUMENTS

| | | | |
|---|---|---|---|
| 6,640,323 B2* | 10/2003 | Akram | 714/724 |
| 7,135,882 B2* | 11/2006 | Kato | 324/750.15 |
| 7,698,470 B2* | 4/2010 | Ruckerbauer et al. | 710/14 |
| 8,283,944 B2* | 10/2012 | Kuroda | 326/37 |
| 8,310,841 B2* | 11/2012 | Foster et al. | 361/803 |
| 2005/0082664 A1* | 4/2005 | Funaba et al. | 257/724 |
| 2005/0289269 A1* | 12/2005 | Nakayama et al. | 710/110 |
| 2008/0111582 A1* | 5/2008 | Matsui et al. | 326/39 |
| 2008/0204091 A1* | 8/2008 | Choo et al. | 327/149 |
| 2010/0027309 A1* | 2/2010 | Park | 365/63 |
| 2011/0050320 A1* | 3/2011 | Gillingham | 327/365 |

FOREIGN PATENT DOCUMENTS

JP 2006-040261 2/2006

* cited by examiner

*Primary Examiner* — Jermele M Hollington
*Assistant Examiner* — Hoang X Nguyen
(74) *Attorney, Agent, or Firm* — IP & T Group LLP

(57) ABSTRACT

A semiconductor system for identifying stacked chips includes a first semiconductor chip and a plurality of second semiconductor chips. The first semiconductor chip generates a plurality of counter codes by using an internal clock or an external input clock and transmits slave address signals and the counter codes through a through-chip via. The second semiconductor chips are given corresponding identifications (IDs) by latching the counter codes for a predetermined delay time, compare the latched counter codes with the slave address signals, and communicate data with the first semiconductor chip through the through-chip via according to the comparison result.

24 Claims, 10 Drawing Sheets

SEMICONDUCTOR SYSTEM AND DEVICE FOR IDENTIFYING STACKED CHIPS AND METHOD THEREOF

CROSS-REFERENCE TO RELATED APPLICATIONS

The present application claims priority of Korean Patent Application No. 10-2010-0065435, filed on Jul. 7, 2010, which is incorporated herein by reference in its entirety.

BACKGROUND OF THE INVENTION

Exemplary embodiments of the present invention relate to semiconductor design technology, and more particularly, to a system and a semiconductor device for identifying stacked chips by using a through-chip via, and a method thereof.

There has been a continuing demand for high-speed, high-density and low-power semiconductor devices, and the integration density of the semiconductor devices has accordingly increased by scaling-down elements to reduce the linewidth (critical dimension). However, since such a method has limitations, various types of stacked package technologies are developed.

FIG. 1 is a view illustrating a conventional multi die package (MDP) with stacked semiconductor chips.

Referring to FIG. 1, an MDP is configured in such a way as to arrange a pad at an edge in a semiconductor device by using a redistributed layer (RDL) and connect a substrate and the edge electrically by using a wire. Here, a different input may be applied from the substrate to each semiconductor chip, and input/output signals of stacked semiconductor chips may be shared or used independently by the semiconductor chips.

In this manner, in a three-dimensional stacked DRAM package (hereinafter referred to as '3DS'), stacked semiconductor chips are interconnected by using an RDL along the edge of each semiconductor chip. Such an edge interconnection may somewhat increase the length and width of the package and need a spare interposer layer between the semiconductor chips. That is, when semiconductor chips are stacked in a package state, a space for wire connection is to be between a pad and a terminal and an interlayer such as an interposer layer is to be inserted between the chips. Therefore, while being advantageous over the case of packaging each semiconductor chip and connecting the semiconductor chip packages in a two-dimensional structure, the case of stacking semiconductor chips in a package state is disadvantageous in terms of the footprint due to an increase in the form factor.

Also, in the above-described chip packaging method, pads may be connected by a gold wire, thus causing a hetero-metal junction. Therefore, the above-described chip packaging method may decrease a data transfer rate and cause a signal skew between stacked dies. The power consumption may be increased due to heat and a signal delay by a parasitic resistance caused at a contact point. Also, in the above-described chip packaging method, when semiconductor chips are stacked by using a wire bonding structure, various concerns may be caused in signal integrity (SI) characteristics.

The technology of a 3DS method for directly stacking semiconductor chips by using a through-chip via is being actively developed to address the above concerns of the MDP using a wire bonding structure.

A through-chip via is also referred to as a through-silicon via (TSV) because a semiconductor chip is generally fabricated using a silicon wafer.

Such a through-silicon via (TSV) is to transfer an internal signal between stacked semiconductor chips. The through-silicon via (TSV) is formed by forming a via (vertical interconnect access) passing through the silicon in a semiconductor chip and filling the via with a conductor (e.g., copper) to form an electrode.

FIG. 2 is a view illustrating a conventional 3DS structure with semiconductor chips stacked by using a through-chip via.

Referring to FIG. 2, a semiconductor device includes a master chip CHIP_1 disposed at the bottom thereof, and a plurality of slave chips CHIP_2 to CHIP_N stacked on the master chip CHIP_1. The master chip CHIP-1 buffers an external signal received from an external control unit, and controls the slave chips CHIP_2 to CHIP_N. The slave chips CHIP_2 to CHIP_N are physically/electrically connected through a through-silicon via TSV to the master chip CHIP_1.

The master chip CHIP_1 transfers a command CMD through the through-silicon via TSV to a semiconductor chip selected from the slave chips CHIP_2 to CHIP_N, and receives an output signal DATA of the selected semiconductor chip through the through-chip via TSV.

However, a problem may arise if the slave chips CHIP_2 to CHIP_N of the same type transmit/receive signals simultaneously.

That is, unless an identification (ID) is given to each of the slave chips CHIP_2 to CHIP_N, it is difficult to determine which of the slave chips CHIP_2 to CHIP_N is to receive a signal transmitted by the master chip CHIP_1 and which of the slave chips CHIP_2 to CHIP_N has transmitted a signal received by the master chip CHIP_1.

FIG. 3 is a view illustrating a conventional method for identifying each semiconductor chip in an MDP.

Referring to FIG. 3, an external signal is applied to each of dies DIE0-DIE3 in an MDP. The dies DIED-DIES have different IDs depending on the corresponding external signals inputted thereto, so that the dies DIE0-DIE3 are identified as different dies DIE0-DIE3. Herein, an RDL is used to form a pad on the edge of each die, and a wire is used to connect a substrate and each pad independently according to the bonding option, where the RDL and wire are used to transmit the external signal.

However, this conventional method may cause a cost increase because a wire bonding structure is used to apply an external signal to each die in the MDP. In particular, if the conventional method is applied to a semiconductor device based on a TSV structure, because the TSV-based semiconductor device has a large number of semiconductor chips stacked therein and may have no edge region for forming a pad, the edge region is to be secured, which may cause disadvantage in terms of the form factor. Therefore, there are demands for a different type of chip-identifying method in the TSV-based semiconductor device.

SUMMARY OF THE INVENTION

An embodiment of the present invention is directed to a system and a semiconductor device for identifying stacked chips by using a through-chip via, and a method thereof.

Another embodiment of the present invention is directed to a method of identifying slave chips independently by using a first transmission line connecting a master chip and the slave chips in series and a second transmission line connecting the master chip and the slave chips in parallel.

In accordance with an exemplary embodiment of the present invention, a semiconductor system for identifying stacked chips includes a first semiconductor chip configured to generate a plurality of counter codes by using an internal clock or an external input clock and to transmit slave address signals and the counter codes through a through-chip via, and a plurality of second semiconductor chips configured to be given corresponding identifications (IDs) by latching the counter codes for a predetermined delay time, to compare the latched counter codes with the slave address signals, and to communicate data with the first semiconductor chip through the through-chip via according to the comparison result.

In accordance with another exemplary embodiment of the present invention, a semiconductor device for identifying stacked chips includes a master chip configured to generate a plurality of counter codes by using an internal clock or an external input clock and to transmit slave address signals and the counter codes through a through-chip via, and a plurality of slave chips configured to be given independent identifications (IDs) by using the counter codes received from the master chip, wherein the counter codes are generated corresponding to the slave chips.

In accordance with yet another exemplary embodiment of the present invention, a semiconductor device for identifying stacked chips includes a master chip configured to transmit a latch enable signal, which is to latch a plurality of counter codes at a plurality of slave chips, through a through-chip via and through a first transmission line connected in series, and a slave chip configured to transmit the counter codes and a plurality of command signals for identifying the plural slave chips, through the through-chip via and through a second transmission line connected in parallel.

In accordance with still another embodiment of the present invention, a method for identifying stacked chips includes generating a plurality of counter codes corresponding to a plurality of slave chips by using an internal clock or an external input clock, transmitting slave address signals and the counter codes through a through-chip via, and giving a corresponding identification (ID) to each of the slave chips by using the transmitted counter codes.

In accordance with still another embodiment of the present invention, a system for identifying stacked chips includes a master chip of the stacked chips configured to generate a plurality of counter codes corresponding to the stacked chips and a latch enable signal to latch the counter codes, and a plurality of slave chips of the stacked chips configured to latch the counter codes in response to the latch enable signal, wherein the plurality of slave chips are indentified by latched counter codes, wherein the latch enable signal is transmitted through a first transmission line connected in series between the master chip and the slave chips through a through-chip via, and the counter codes and transmitted through second transmission lines connected in parallel between the master chip and the slave chips through the through-chip via.

DESCRIPTION OF SPECIFIC EMBODIMENTS

Figure 1:
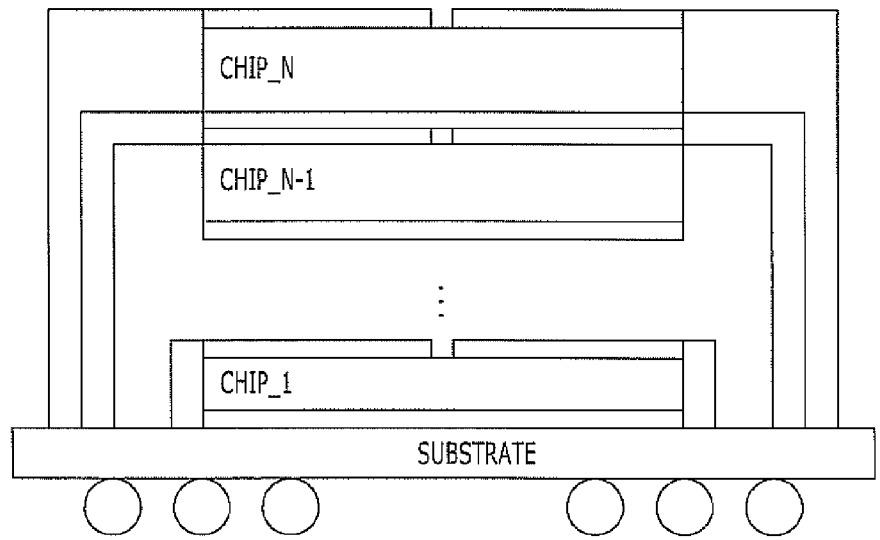
FIG. 1 is a view illustrating a conventional multi die package (MDP) with stacked semiconductor chips.
Figure 2:
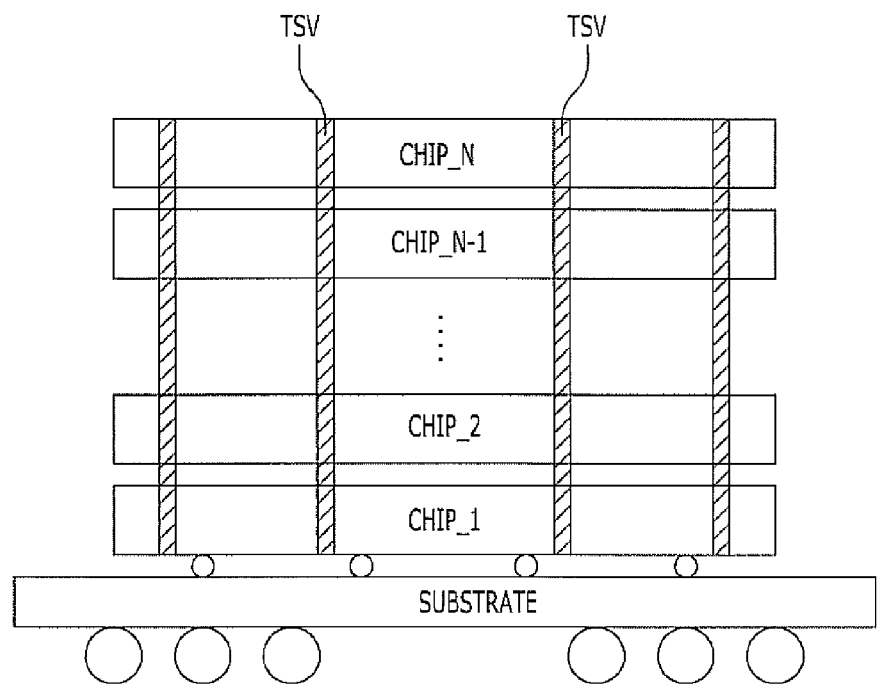
FIG. 2 is a view illustrating a conventional 3DS structure with semiconductor chips stacked by using a through-chip via.
Figure 3:
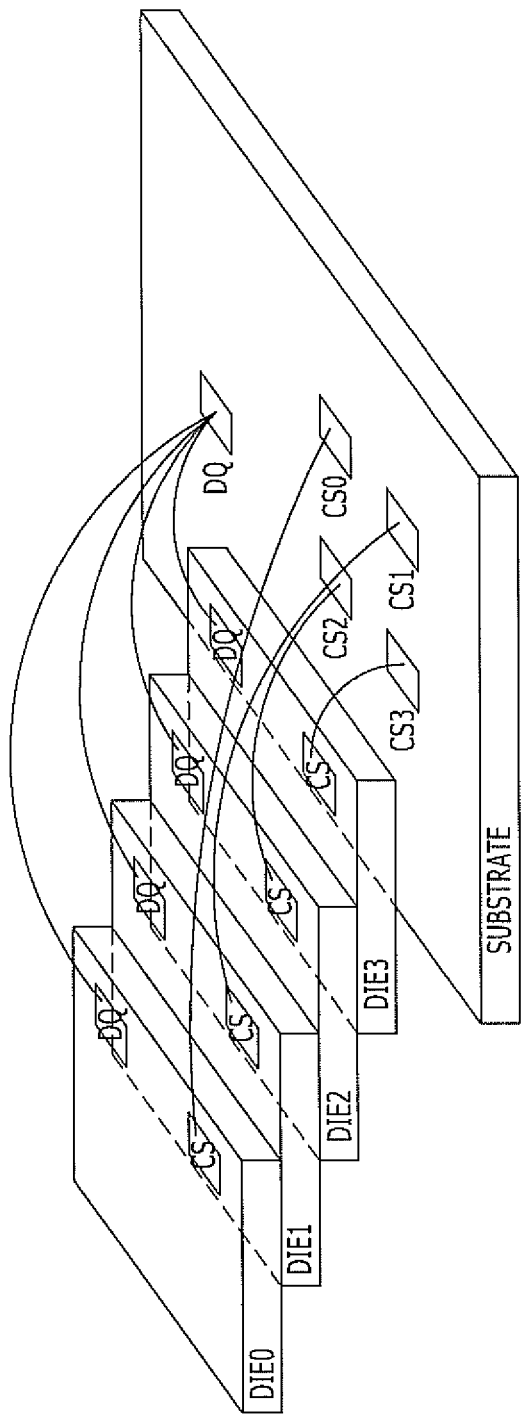
FIG. 3 is a view illustrating a conventional method for identifying each semiconductor chip in an MDP.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The following description is made on the assumption of stacking eight slave chips as an example.

Figure 4:
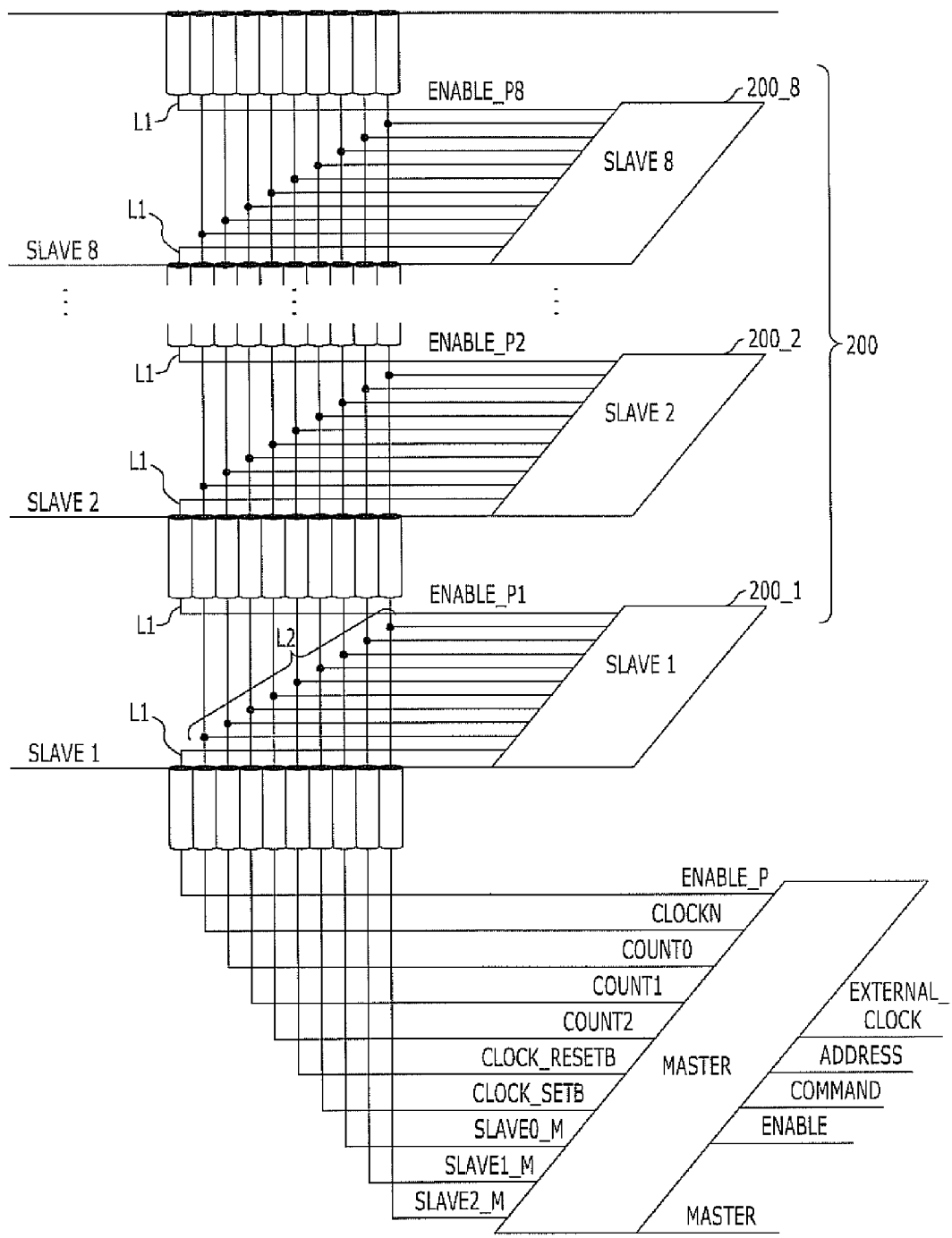
FIG. 4 is a circuit diagram illustrating a semiconductor device identifying stacked chips in accordance with an embodiment of the present invention.

FIG. 4 is a circuit diagram illustrating a semiconductor device identifying stacked chips in accordance with an embodiment of the present invention.

Referring to FIG. 4, a semiconductor device identifying stacked chips in accordance with an embodiment of the present invention includes a master chip 100 and a plurality of slave chips 200.

The master chip 100 generates a plurality of counter codes COUNT0, COUNT1 and COUNT2, corresponding to the slave chips 200, by using an internal clock or an external input clock EXTERNAL_CLOCK in response to a command signal COMMAND.

The master chip 100 transmits a latch enable signal ENABLE_P, which is used to latch the counter codes COUNT0, COUNT1 and COUNT2 at the slave chips 200, to the slave chips 200 through a first transmission line L1 that is connected with the slave ships 200 in series through a through-chip via.

The master chip 100 transmits a driving clock CLOCKN, which is generated by reducing the frequency of the internal clock or the external input clock EXTERNAL_CLOCK by a factor of approximately 1/N, the counter codes COUNT0, COUNT1 and COUNT2, and a plurality of command signals (e.g., a start signal CLOCK_SETB, an end signal CLOCK_RESETB, and slave address signals SLAVE0_M, SLAVE1_M and SLAVE2_M) to the slave chips 200 at due times through second transmission lines L2 that are connected with the slave chips 200 in parallel through a through-chip via.

Among the command signals (e.g., the start signal CLOCK_SETB, the end signal CLOCK_RESETB, and the slave address signals SLAVE0_M, SLAVE1_M and SLAVE2_M), the start signal CLOCK_SETB has information indicating the start of identification of the slave chip. The start signal CLOCK_SETB is used to generate the driving clock CLOCKN for identifying the slave chip by using the external input clock EXTERNAL_CLOCK or the internal clock. Simultaneously, the start signal CLOCK_SETB is transmitted to the slave chip 200 to initialize the previously-latched counter code. The so-generated driving clock CLOCKN is used to control/generate commands for identifying the slave chip. The end signal CLOCK_RESETB has information indicating the completion of identification of the slave chip. The slave address signals SLAVE0_M, SLAVE1_M and SLAVE2_M are generated by synchronizing an address signal ADDRESS that is encoded to access a selected semiconductor chip with the external input clock EXTERNAL_CLOCK.

Herein, the first transmission line L1 connects the master chip 100 and the first slave chip 200_1 in series through the through-chip via, and connects the first slave chip 200_1 and the second slave chip 200_2 in series through the through-chip via. In this manner, the slave chips 200_2, . . . , 200_N are connected in series to each other through the through-chip via. Also, the second transmission line L2 connects the master chip 100 and the first slave chip 200_1, the second slave chip 200_2, . . . , the eighth slave chip 200_8 in parallel through the through-chip via.

That is, the so-generated signals are sequentially transmitted to the upper slave chip 200 respectively through the first transmission line L1 connected in series and the second transmission line L2 connected in parallel, and the counter codes COUNT0, COUNT1 and COUNT2 generate an encoded signal according to the number of stacked slave chips 200. If two slave chips are stacked, one counter code is used to generate encoded signals of '0' and '1' sequentially with time. If four slave chips are stacked, two counter codes are used to generate encoded signals of '00', '01', '10' and '11' sequentially. In this manner, if N slave chips are stacked, log 2 (N) counter codes are used for a signal generation. Each slave chip 200 receives/latches (buffers) the counter codes to generate slave ID signals SLAVE0_C, SLAVE1_C and SLAVE2_C that retain the same information.

Through the above serial processes, a different ID is given to each slave chip 200. Also, in a 3DS (three-dimensional stacked DRAM package) using a through-chip via structure, an operation of giving an ID to each slave chip may be performed automatically upon completion of an external power applying operation POWER_UP and a reset operation RESET, or may be performed in response to a command applied in due time.

In this manner, after an ID is given to each slave chip, the slave chip 200 compares the previously-latched counter code information COUNT0/COUNT1/COUNT2 with the received slave address SLAVE0_M/SLAVE1_M/SLAVE2_M, and communicates data with the master chip 100 if the previously-latched counter code information COUNT0/COUNT1/COUNT2 is equal to the received slave address SLAVE0_M/SLAVE1_M/SLAVE2_M. Accordingly, the slave chip 200 may perform a core operation according to the core operation command and address received from the master chip 100.

In another embodiment, the above operation of the master chip 100 may be processed in a package state through a program operation by using a test mode and an electrical fuse.

The configuration and operation of the master chip 100 and the configuration and operation of the slave chip 200 is described below in detail.

Figure 5:
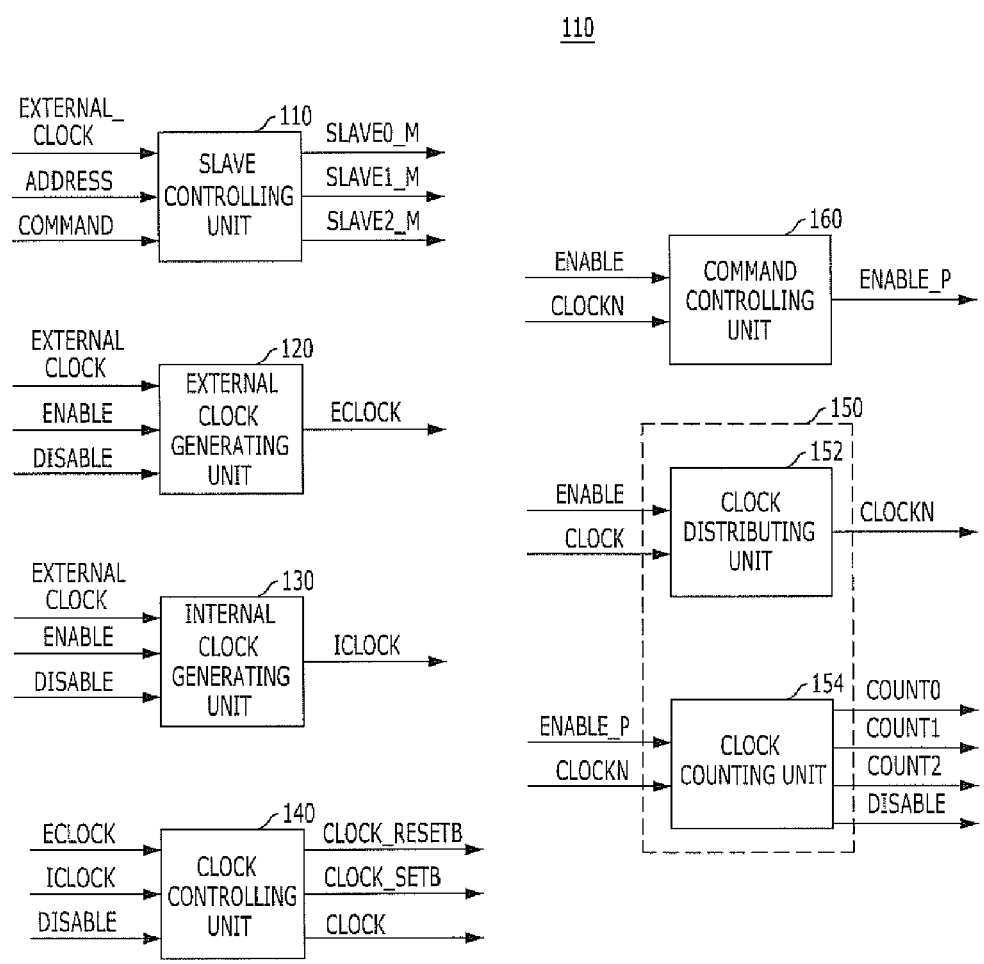
FIG. 5 is a circuit diagram illustrating a detailed configuration of a master chip of FIG. 4 in accordance with an embodiment of the present invention.

FIG. 5 is a circuit diagram illustrating a detailed configuration of the master chip 100 of FIG. 4 in accordance with an embodiment of the present invention.

Referring to FIG. 5, the master chip 100 includes a slave controlling unit 110, an external clock generating unit 120, an internal clock generating unit 130, a clock controlling unit 140, a clock driving unit 150, and a command (CMD) controlling unit 160.

The slave controlling unit 110 receives an external input clock EXTERNAL_ClOCK, an address signal ADDRESS and a command signal COMMAND from an external device, and buffers/latches the received address signal ADDRESS and the received command signal COMMAND in response to the received external input clock EXTERNAL_CLOCK. Herein, if a 3-bit address is latched, three circuits having the same structure may be used for the latching operation.

The slave controlling unit 110 generates slave address signals SLAVE0_M, SLAVE1_M and SLAVE2_M, which are used to select the slave chip, in synchronization with the external input clock EXTERNAL_CLOCK by using the latched address/command signals, and provides the generated slave address signals SLAVE0_M, SLAVE1_M and SLAVE2_M to the slave chip 200.

Herein, the command signal COMMAND is a pulse signal that is generated by a predetermined command, which is generally a pulse command that is generated when a DRAM is activated.

Figure 6:
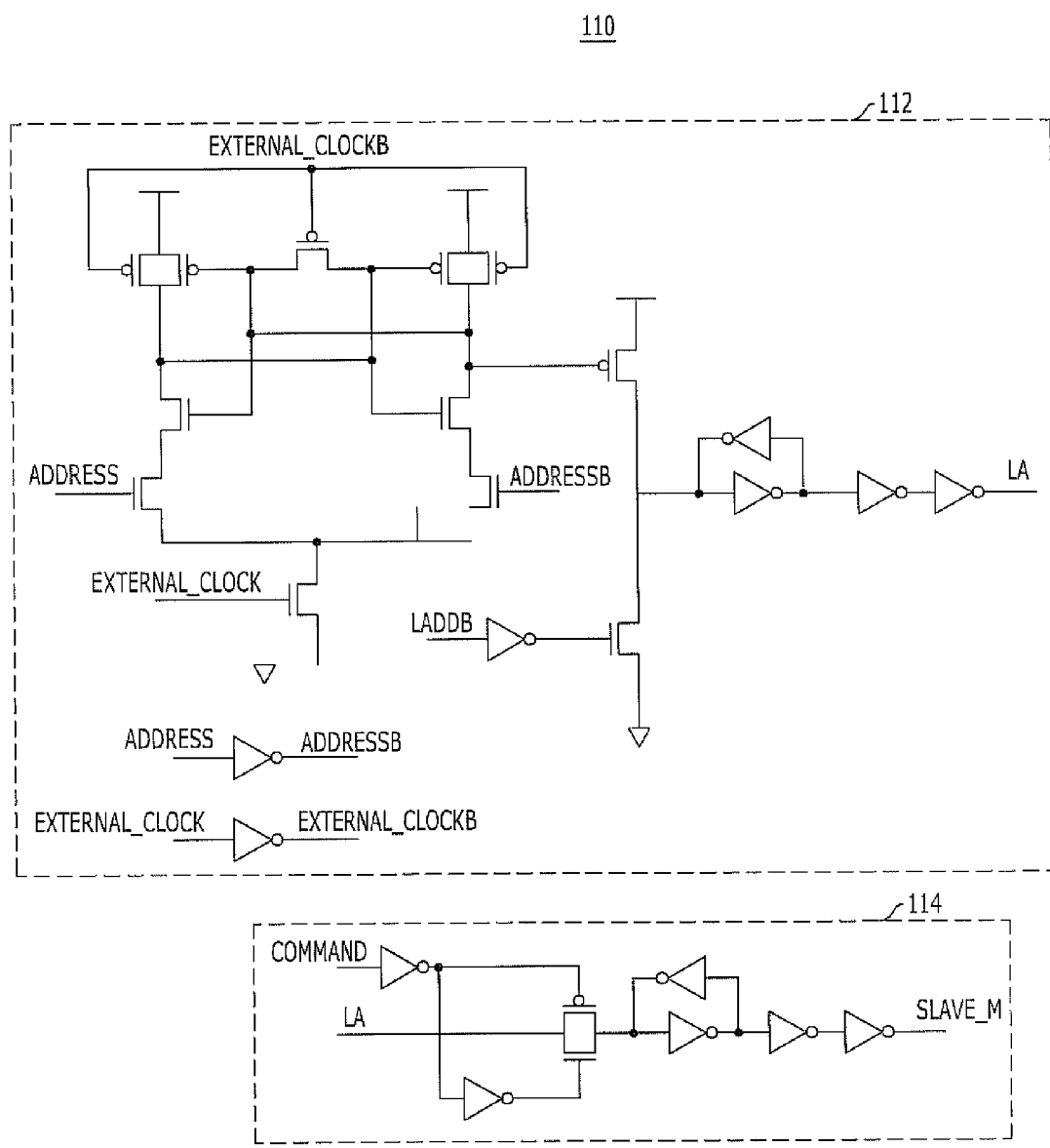
FIG. 6 is a circuit diagram illustrating a detailed configuration of a slave controlling unit of FIG. 5 in accordance with an embodiment of the present invention.

FIG. 6 is a circuit diagram illustrating a detailed configuration of the slave controlling unit 110 of FIG. 5 in accordance with an embodiment of the present invention.

Referring to FIG. 6, the slave controlling unit 110 includes a latch block 112 and a slave address signal generating block 114.

The latch block 112 receives the external input clock EXTERNAL_CLOCK and the address signal ADDRESS from an external device, and inverts the received external input clock EXTERNAL_CLOCK and the received address signal ADDRESS to generate an inverted external input clock EXTERNAL_CLOCKB and an inverted address signal ADDRESSB.

The latch block 112 generates a latched address signal LA by using the external input clock EXTERNAL_CLOCK, the address signal ADDRESS, the inverted external input clock EXTERNAL_CLOCKB and the inverted address signal ADDRESSB.

The slave address signal generating block 114 receives the latched address signal LA from the latch block 112, and receives the command signal COMMAND from an external device.

The slave address signal generating block 114 generates the slave address signals SLAVE0_M, SLAVE1_M and SLAVE2_M in synchronization with the external input clock EXTERNAL_CLOCK in response to the received command signal COMMAND, and provides the generated slave address signals SLAVE0_M, SLAVE1_M and SLAVE2_M to the slave chip 200.

As illustrated in FIG. 5, the external clock generating unit 120 receives the external input clock EXTERNAL_CLOCK and an enable signal ENABLE from an external device, receives a disable signal DISABLE from the clock driving unit 150, generates an external clock ECLOCK by using the external input clock EXTERNAL_CLOCK in an slave identification (ID) period (see FIG. 12), and provides the generated external clock ECLOCK to the clock controlling unit 140.

That is, the present invention controls the activation of the external input clock EXTERNAL_CLOCK in the period other than the slave identification period, thus preventing a power consumption. The external clock generating unit 120 is enabled by the enable signal ENABLE and is disabled by the disable signal DISABLE.

The external clock generating unit 120 may be configured in various types, and thus a description of the detailed circuit configuration thereof is omitted for conciseness.

The internal clock generating unit 130 receives the external input clock EXTERNAL_CLOCK and the enable signal ENABLE from an external device, receives a disable signal DISABLE from the clock driving unit 150, generates an internal clock ICLOCK in response to the external input clock EXTERNAL_CLOCK, the enable signal ENABLE and the disable signal DISABLE, and provides the generated internal clock ICLOCK to the clock controlling unit 140.

The internal clock generating unit 130 is to use the internal clock ICLOCK if the external input clock EXTERNAL_CLOCK is unavailable. The internal clock generating unit 130 is enabled by the enable signal ENABLE and is disabled by the disable signal DISABLE.

The internal clock generating unit 130 may be configured in various types, and thus a description of the detailed circuit configuration thereof is omitted for conciseness.

The clock controlling unit 140 receives the external clock ECLOCK from the external clock generating unit 120, receives the internal clock ICLOCK from the internal clock generating unit 130, and receives the disable signal DISABLE from the clock driving unit 150.

The clock controlling unit 140 selects one of the received external clock ECLOCK and the received internal clock ICLOCK, and outputs the selected clock (CLOCK=ECLOCK or ICLOCK) to the clock driving unit 150.

The clock controlling unit 140 generates a start signal CLOCK_SETB and an end signal CLOCK_RESETB, which are to determine an activation period of the selected clock (i.e., a slave identification period), and provides the start signal CLOCK_SETB and the end signal CLOCK_RESETB to the slave chips 200.

The clock controlling unit 140 may be configured in various types, and thus a description of the detailed circuit configuration thereof is omitted for conciseness.

The clock driving unit 150 includes a clock distributing unit 152 and a clock counting unit 154. The clock driving unit 150 receives the selected clock CLOCK from the clock controlling unit 140, and receives the enable signal ENABLE from an external device.

The clock driving unit 150 generates a driving clock CLOCKN for a slave chip identifying operation by using the selected clock, and provides the generated driving clock CLOCKN to the command controlling unit 160 and the slave chips 200.

The clock distributing unit 152 generates the driving clock CLOCKN by reducing the frequency of the selected clock CLOCK by a factor of approximately 1/N, and provides the generated driving clock CLOCKN to the command controlling unit 160, the clock counting unit 154 and the slave chips 200.

Herein, 'N' may be 2, 4, 8, . . . , i.e., a multiple of 2, for easy timing. If necessary, 'N' may be a natural number such as 1, 2, 3, . . . .

The clock counting unit 154 receives the driving clock CLOCKN from the clock distributing unit 152, receives a clock-synchronized latch enable signal ENABLE_P from the command controlling unit 160, and generates counter code information COUNT0/COUNT1/COUNT2 by using the received driving clock CLOCKN and the received latch enable signal ENABLE_P. Herein, the clock counting unit 154 may operate in synchronization with the driving clock CLOCKN, and may include a ring counter that has a plurality of flip-flops connected and feeds back the output of the last flip-flop as the input of the first flip-flop.

Also, upon completion of the generation of corresponding counter code information, the clock counting unit 154 generates a disable signal DISABLE for completion of an operation, and provides the generated disable signal DISABLE to the external dock generating unit 120, the internal dock generating unit 130 and the clock controlling unit 140.

The clock driving unit 150 may be configured in various types, and thus a description of the detailed circuit configuration thereof is omitted for conciseness.

In another embodiment, each slave chip 200 transmits command signals ENABLE_P1, ENABLE_P2, ENABLE_PN, which are used to latch the counter code information, to the master chip 100 through the second transmission line L2 connected in parallel, and the master chip 100 uses the same signal as a toggle clock of a toggle flip-flop (TFF), thereby generating the disable signal DISABLE by using the last output of the TFF after receiving the last command signal ENABLE_PN from the uppermost slave chip 200_N.

In yet another embodiment, the first transmission line L1 is added to transmit the last command signal ENABLE_PN from the uppermost slave chip 200_N to the master chip 100, and the same signal is used to generate the disable signal DISABLE.

The command controlling unit 160 receives the enable signal ENABLE from an external device, and receives the driving clock CLOCKN from the clock distributing unit 152. The command controlling unit 160 generates the latch enable signal ENABLE_P for a slave chip identifying operation in synchronization of the driving clock CLOCKN in response to the received enable signal ENABLE, and provides the generated latch enable signal ENABLE_P to the clock counting unit 154 and the slave chip 200.

Herein, the command controlling unit 160 may include a shift register with a plurality of flip-flops connected, and the latch enable signal ENABLE_P may be 1 clock signal (ENABLE10), 1.5 clock signal (ENABLE15), 2 clock signal (ENABLE20) or 2.5 clock signal (ENABLE25) according to the pulse of the driving clock CLOCKN.

In another embodiment, one of the external clock generating unit 120 and the internal clock generating unit 130 illustrated in FIG. 5 may be provided, and the output signal thereof may be provided directly to the clock controlling unit 140. In yet another embodiment, both of the external clock generating unit 120 and the internal clock generating unit 130 illustrated in FIG. 5 may be removed, and the external input clock EXTERNAL_CLOCK may be provided directly to the clock controlling unit 140.

Figure 7:
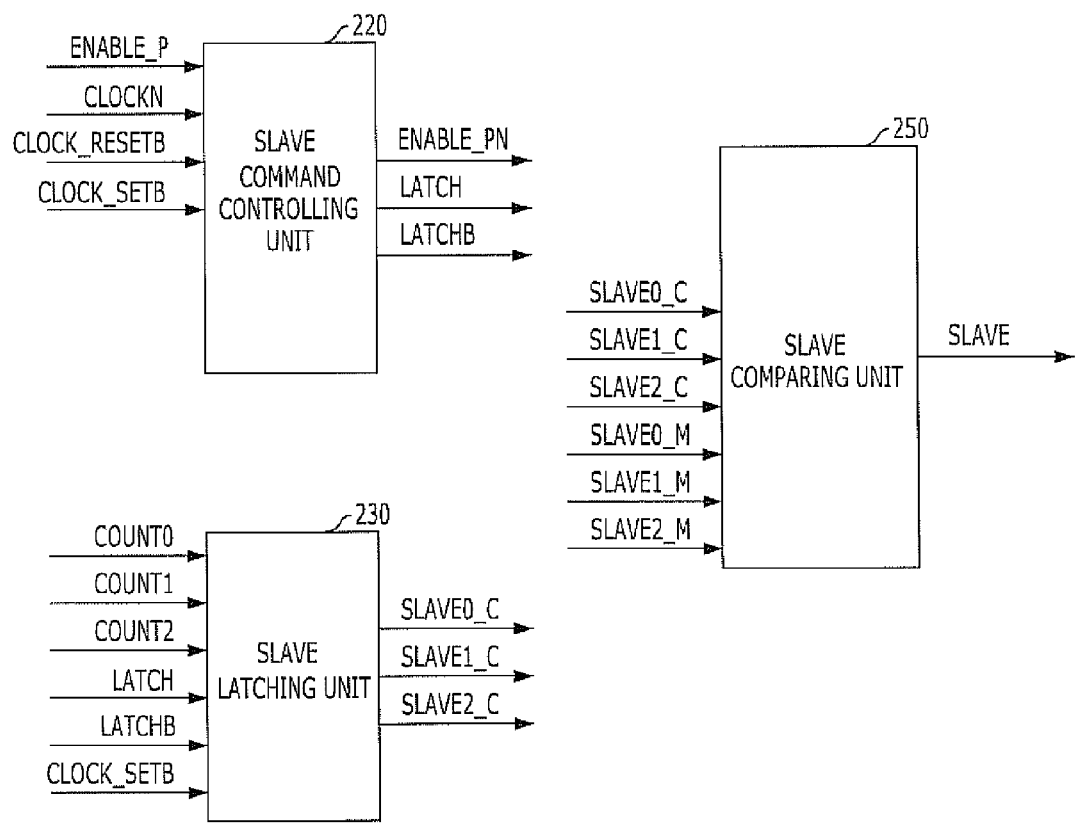
FIG. 7 is a circuit diagram illustrating a detailed configuration of slave chips of FIG. 4 in accordance with an embodiment of the present invention.

FIG. 7 is a circuit diagram illustrating a detailed configuration of the slave chips 200 of FIG. 4 in accordance with an embodiment of the present invention.

Referring to FIG. 7, each of the slave chips 200 includes a slave command controlling unit 220, a slave latching unit 230, and a slave comparing unit 250.

The slave command controlling unit 220 receives the latch enable signal ENABLE_P, the driving clock CLOCKN, the start signal CLOCK_SETB and the end signal CLOCK_RE-SETB, and uses the received latch enable signal ENABLE_P, the received driving clock CLOCKN, the received start signal CLOCK_SETB and the received end signal CLOCK_RE-SETB to generate an upper latch enable signal ENABLE_PN for use in the upper slave chip, and an inverted latch signal LATCHB and a latch signal LATCH for latching the counter code information.

Figure 8:
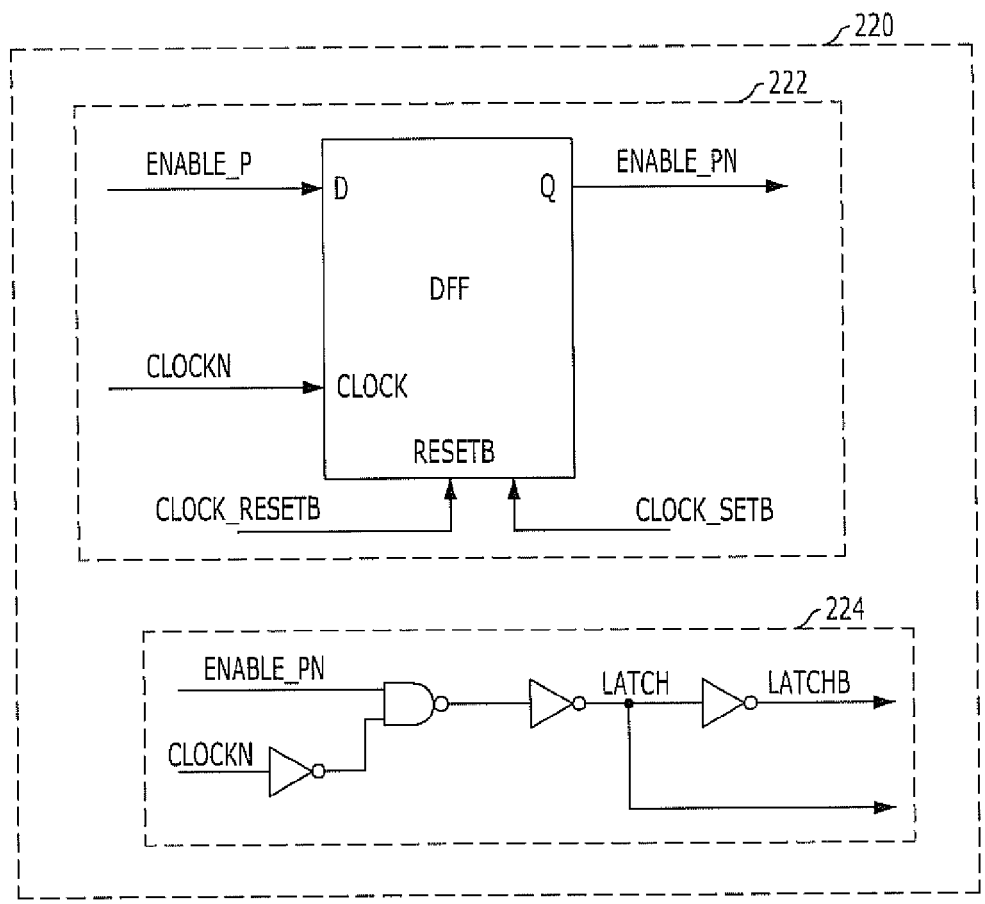
FIG. 8 is a circuit diagram illustrating a detailed configuration of a slave command controlling unit of FIG. 7 in accordance with an embodiment of the present invention.

FIG. 8 is a circuit diagram illustrating a detailed configuration of the slave command controlling unit 220 of FIG. 7 in accordance with an embodiment of the present invention.

Referring to FIG. 8, the slave command controlling unit 220 includes an upper latch enable signal generating block 222 and a latch signal generating block 224.

The upper latch enable signal generating block 222 receives the latch enable signal ENABLE_P from the master chip 100 through the first transmission line L1 connected in series, and receives the driving clock CLOCKN, the start signal CLOCK_SETB and the end signal CLOCK_RESETB from the master chip 100 through the second transmission line L2 connected in parallel.

The upper latch enable signal generating block 222 uses the received latch enable signal ENABLE_P, the received driving clock CLOCKN, the received start signal CLOCK_SETB and the received end signal CLOCK_RE-SETB to generate the upper latch enable signal ENABLE_PN for use in the upper slave chip, and transmits the generated upper latch enable signal ENABLE_PN to the upper slave chip 200_N and the latch signal generating block 224.

The latch signal generating block 224 uses the received upper latch enable signal ENABLE_PN and the driving signal CLOCKN to generate the inverted latch signal LATCHB and the latch signal LATCH for latching the counter code information, and provides the generated latch signal LATCH and the inverted latch signal LATCHB to the slave latching unit 230.

Herein, the latch signal LATCH may be initialized and retained by using the start signal CLOCK_SETB and the end signal CLOCK_RESETB.

As illustrated in FIG. 7, the slave latching unit 230 receives the counter code information COUNT0/COUNT1/COUNT2 and the start signal CLOCK_SETB from the master chip 100, and receives the latch signal LATCH and the inverted latch signal LATCHB from the slave command controlling unit 220.

Figure 9:
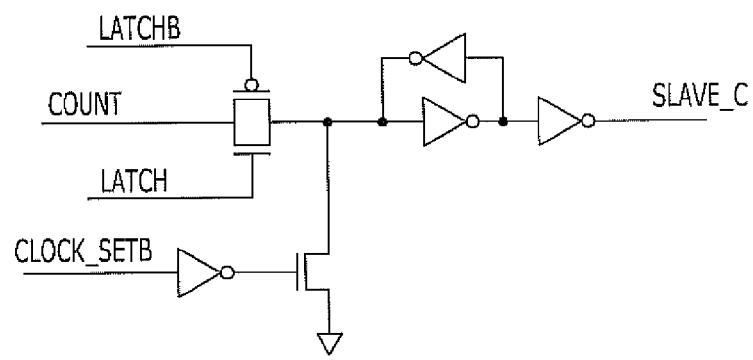
FIG. 9 is a circuit diagram illustrating a detailed configuration of a slave latching unit of FIG. 7 in accordance with an embodiment of the present invention.

FIG. 9 is a circuit diagram illustrating a detailed configuration of the slave latching unit 230 of FIG. 7 in accordance with an embodiment of the present invention.

Referring to FIG. 9, the slave latching unit 230 latches the received counter code information COUNT0/COUNT1/COUNT2 in response to the latch signal LATCH, the inverted latch signal LATCHB and the start signal CLOCK_SETB, uses the latched counter code information to generate slave ID signals SLAVE0_C/SLAVE1_C/SLAVE2_C for use as an ID in each slave chip, and provides the generated slave ID signals SLAVE0_C, SLAVE1_C and SLAVE2_C to the slave comparing unit 250.

As illustrated in FIG. 7, the slave comparing unit 250 receives the slave address signals SLAVE0_M, SLAVE1_M and SLAVE2_M and the slave ID signals SLAVE0_C, SLAVE1_C and SLAVE2_C, compares the slave address signal SLAVE0_M/SLAVE1_M/SLAVE2_M with the slave ID signal SLAVE0_C/SLAVE1_C/SLAVE2_C, and generates a slave driving signal SLAVE if the slave address signal SLAVE0_M/SLAVE1_M/SLAVE2_M is equal to the slave ID signal SLAVE0_C/SLAVE1_C/SLAVE2_C.

Figure 10:
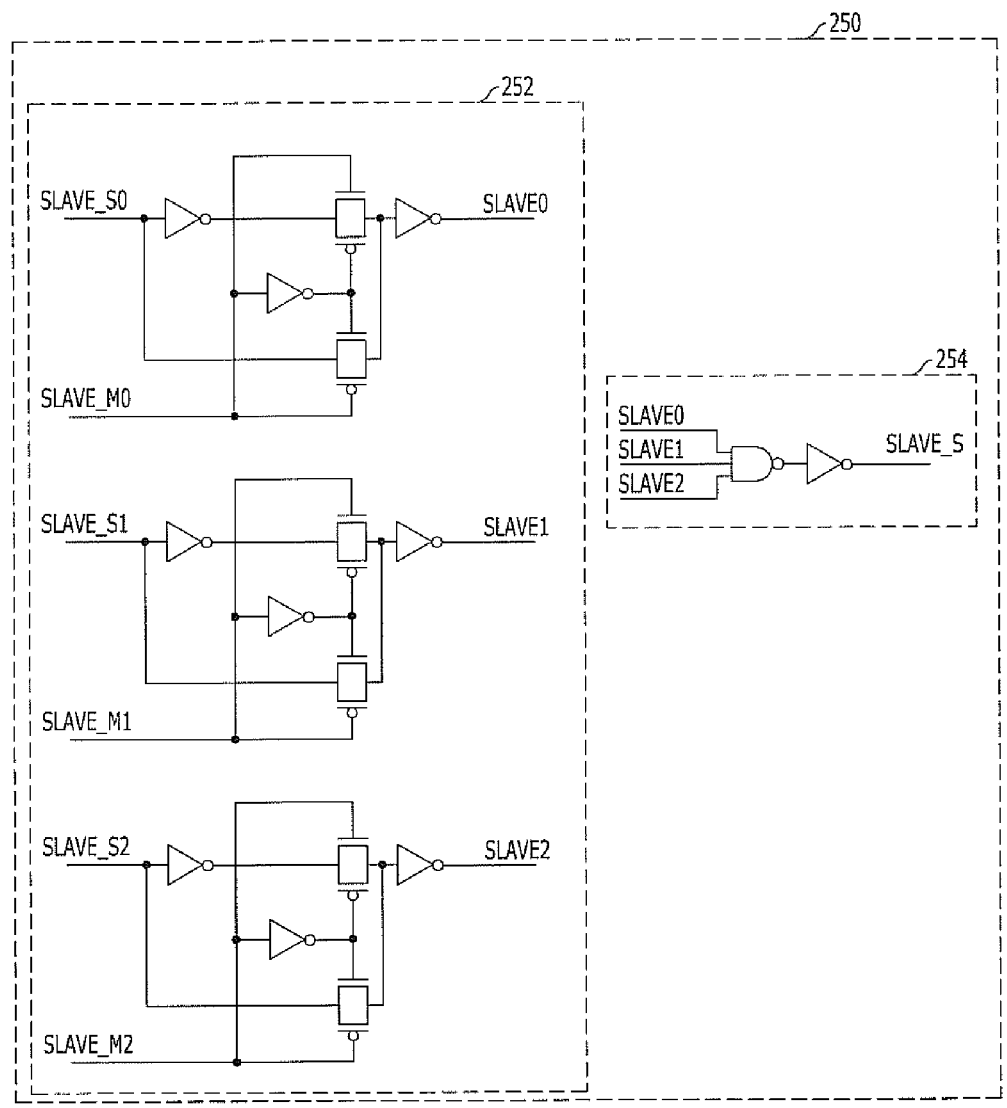
FIG. 10 is a circuit diagram illustrating a detailed configuration of a slave comparing unit of FIG. 7 in accordance with an embodiment of the present invention.

FIG. 10 is a circuit diagram illustrating a detailed configuration of the slave comparing unit 250 of FIG. 7 in accordance with an embodiment of the present invention.

Referring to FIG. 10, the slave comparing unit 250 includes a slave comparing block 252 and a slave driving signal outputting block 254.

The slave comparing block 252 receives the slave address signals SLAVE0_M, SLAVE1_M and SLAVE2_M from the master chip 100, receives the slave ID signals SLAVE0_C, SLAVE1_C and SLAVE2_C from the slave latching unit 230, compares the slave address signal SLAVE0_M/SLAVE1_M/SLAVE2_M with the slave ID signal SLAVE0_C/SLAVE1_C/SLAVE2_C, and provides the comparison results SLAVE0, SLAVE1 and SLAVE2 to the slave driving signal outputting block 254.

The slave driving signal outputting block 254 receives the comparison results SLAVED, SLAVE1 and SLAVE2 from the slave comparing block 252. If the received comparison result is consistent, the slave driving signal outputting block 254 generates the slave driving signal SLAVE for driving a transmitter and a receiver of the corresponding slave chip 200 and provides the slave driving signal SLAVE to the transmitter and the receiver of the corresponding slave chip 200 to communicate data between the master chip 100 and the corresponding slave chip 200.

Figure 11:
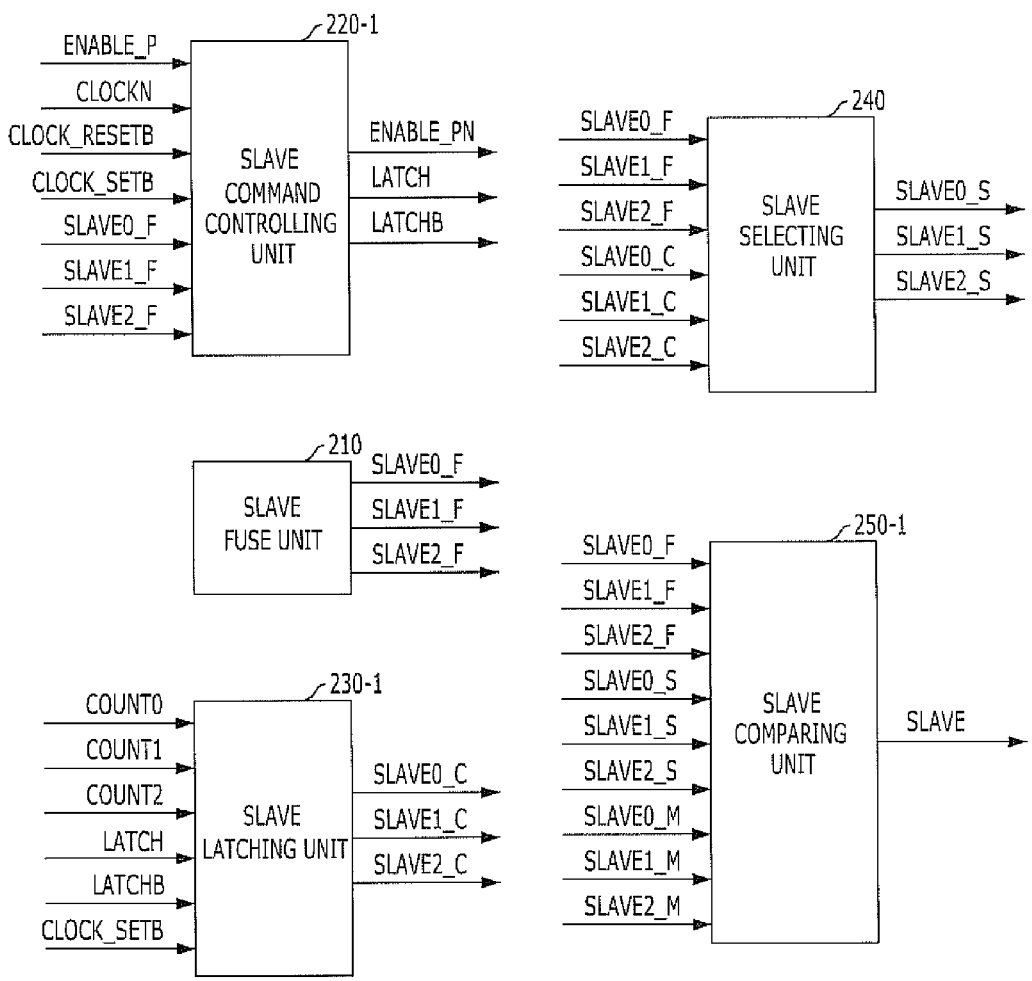
FIG. 11 is a circuit diagram illustrating a detailed configuration of slave chips of FIG. 4 in accordance with another embodiment of the present invention.

FIG. 11 is a circuit diagram illustrating a detailed configuration of the slave chips 200 of FIG. 4 in accordance with another embodiment of the present invention.

Referring to FIG. 11, each of the slave chips 200 includes a slave fuse unit 210, a slave command controlling unit 220-1, a slave latching unit 230-1, a slave selecting unit 240, and a slave comparing unit 250-1.

If some of the stacked slave chips 200 are defective/inoperative, the slave fuse unit 210 generates slave fuse signals SLAVE0_F, SLAVE1_F and SLAVE2_F by using an electrical fuse for bypassing the corresponding slave fuse chips and preventing transmission of information about the corresponding slave chips.

The slave fuse unit 210 provides the generated slave fuse signals SLAVE0_F, SLAVE1_F and SLAVE2_F to the slave command controlling unit 220-1, the slave selecting unit 240 and the slave comparing unit 250-1 to control the slave command controlling unit 220-1, the slave selecting unit 240 and the slave comparing unit 250-1.

That is, when a plurality of slave chips are stacked, if some of the stacked slave chips are defective/inoperative, the present invention gives IDs only to the normal slave chips in order to prevent all the slave chips from being discarded.

In another embodiment, a program operation may be used to generate the slave fuse signals SLAVE0_F, SLAVE1_F and SLAVE2_F.

The slave command controlling unit 220-1 receives the latch enable signal ENABLE_P from the master chip 100 through the first transmission line L1 connected in series, receives the driving clock CLOCKN, the start signal CLOCK_SETB and the end signal CLOCK_RESETB from the master chip 100 through the second transmission line L2 connected in parallel, and receives the slave fuse signals SLAVE0_F, SLAVE1_F and SLAVE2_F from the slave fuse unit 210.

The slave command controlling unit 220-1 uses the received latch enable signal ENABLE_P, the received driving clock CLOCKN, the received start signal CLOCK_SETB and the received end signal CLOCK_RESETB to generate an upper latch enable signal ENABLE_PN for use in the upper slave chip, and transmits the upper latch enable signal ENABLE_PN to the upper slave chip 200_N.

The slave command controlling unit 220-1 uses the received latch enable signal ENABLE_P, the received driving clock CLOCKN, the received start signal CLOCK_SETB and the received end signal CLOCK_RESETB to generate an inverted latch signal LATCHB and a latch signal LATCH for latching the counter code information, and provides the generated latch signal LATCH and the inverted latch signal LATCHB to the slave latching unit 230-1.

Herein, the latch signal LATCH may be initialized and retained by using the start signal CLOCK_SETB and the end signal CLOCK_RESETB.

If the first slave chip 200_1 is defective, the state value of the slave fuse signals SLAVE0_F, SLAVE1_F and SLAVE2_F may become '000'. According to the state value of the slave fuse signals SLAVE0_F, SLAVE1_F and SLAVE2_F, the slave command controlling unit 220-1 transmits the upper latch enable signal ENABLE_PN for the upper slave chip 200_2 to the upper slave chip 200-2 to latch the corresponding counter code information at the upper slave chip 200_2 and simultaneously prevent the slave comparing unit 250-1 from generating the slave driving signal SLAVE.

Also, the slave latching unit 230-1 receives the counter code information COUNT0, COUNT1 and COUNT2 and the start signal CLOCK_SETB from the master chip 100, and receives the latch signal LATCH and the inverted latch signal LATCHB from the slave command controlling unit 220-1.

The slave latching unit 230-1 latches the received counter code information COUNT0, COUNT1 and COUNT2 in response to the latch signal LATCH and the inverted latch signal LATCHB, uses the latched counter code information to generate slave ID signals SLAVE0_C/SLAVE1_C/SLAVE2_C for use as an ID in the slave chip 200, and provides the generated slave ID signals SLAVE0_C, SLAVE1_C and SLAVE2_C to the slave selecting unit 240.

The slave selecting unit 240 receives the slave fuse signals SLAVE0_F, SLAVE1_F and SLAVE2_F from the slave fuse unit 210, and receives the slave ID signals SLAVE0_C, SLAVE1_C and SLAVE2_C from the slave latching unit 230-1.

The slave selecting unit 240 selectively outputs the received slave fuse signals SLAVE0_F, SLAVE1_F and SLAVE2_F and slave ID signals SLAVE0_C, SLAVE1_C and SLAVE2_C as slave selection signals SLAVE0_S, SLAVE1_S and SLAVE2_S.

Herein, the slave fuse signals SLAVE0_F, SLAVE1_F and SLAVE2_F may be used as a signal containing information that indicates a defective/inoperative state as well as a test state of the corresponding slave chip 200.

The slave comparing unit 250-1 receives the slave address signals SLAVE0_M, SLAVE1_M and SLAVE2_M from the master chip 100, receives the slave fuse signals SLAVE0_F, SLAVE1_F and SLAVE2_F from the slave fuse unit 210, and receives the slave selection signals SLAVE0_S, SLAVE1_S and SLAVE2_S from the slave selecting unit 240.

The slave comparing unit 250-1 compares the received slave selection signals SLAVE0_S, SLAVE1_S and SLAVE2_S with the slave address signals SLAVE0_M, SLAVE1_M and SLAVE2_M. If the slave selection signal SLAVE0_S/SLAVE1_S/SLAVE2_S is equal to the slave address signal SLAVE0_M/SLAVE1_M/SLAVE2_M, the slave comparing unit 250-1 generates a slave driving signal SLAVE for driving a transmitter and a receiver of the corresponding slave chip 200 and provides the slave driving signal SLAVE to the transmitter and the receiver of the corresponding slave chip 200 to communicate data between the master chip 100 and the corresponding slave chip 200.

Figure 12:
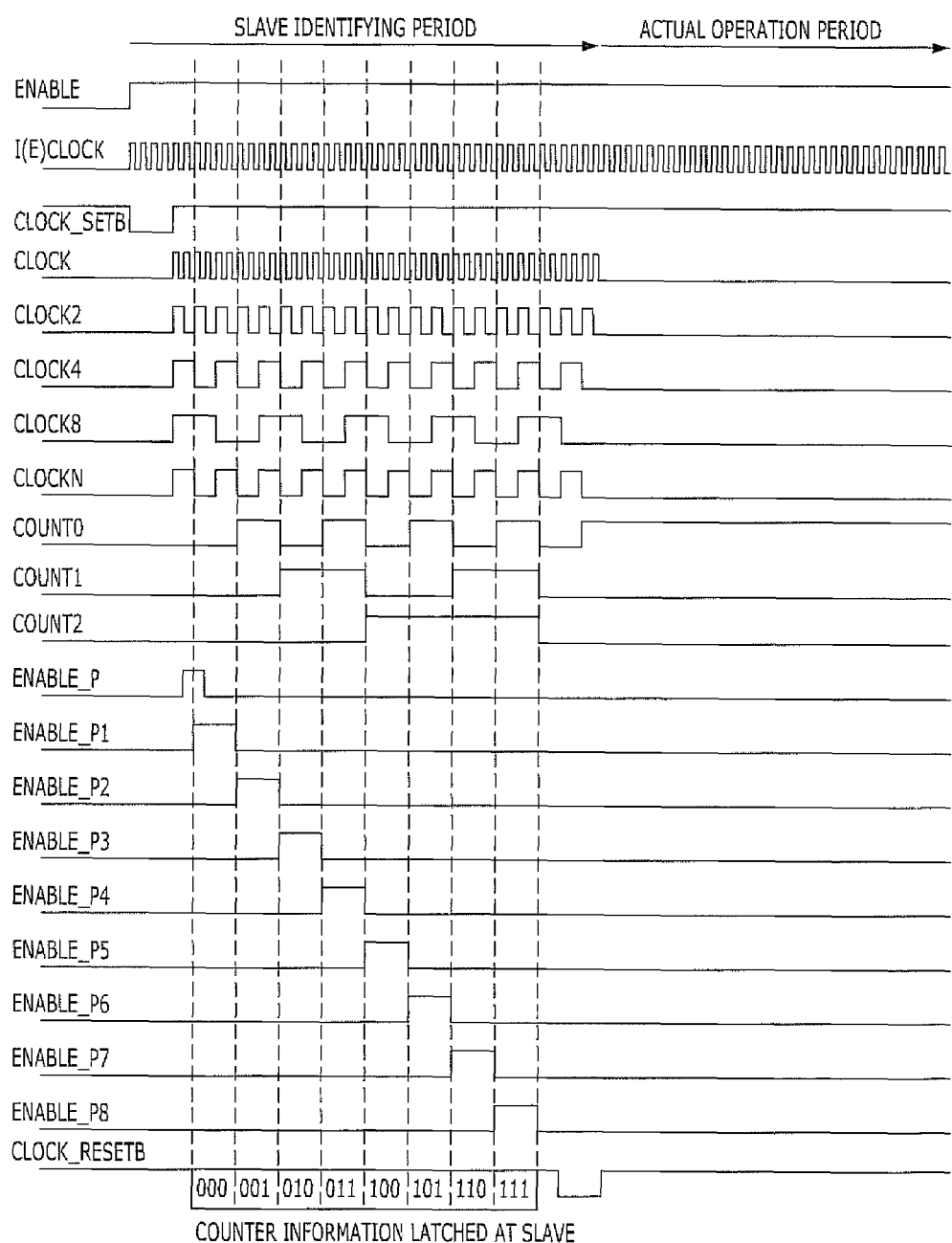
FIG. 12 is a timing diagram illustrating the timing of signals for identifying stacked chips in a semiconductor device in accordance with an embodiment of the present invention.

FIG. 12 is a timing diagram illustrating the timing of signals for identifying stacked chips in the semiconductor device in accordance with an embodiment of the present invention.

For example, if COUNT0=0, COUNT1=0 and COUNT2=0, i.e., three digit counter codes having '000', the first latch enable signal ENABLE_P1 has a high logic value (e.g., 1). Accordingly, the first slave chip 200_1 is selected to communicate data with the master chip 100.

If COUNT0=1, COUNT1=0 and COUNT2=0, the second latch enable signal ENABLE_P2 has a high logic value (e.g., 1). Accordingly, the second slave chip 200_2 is selected to communicate data with the master chip 100.

In this manner, the second to seventh slave chips are selected to communicate data with the master chip 100.

If COUNT0=1, COUNT1=1 and COUNT2=1, the eighth latch enable signal ENABLE_P8 has a high logic value (e.g., 1). Accordingly, the eight slave chip 200_8 is selected to communicate data with the master chip 100.

In the above embodiment, the semiconductor device identifying a plurality of slave chips has been described as an example. However, in another exemplary embodiment, the present invention may also be applicable to any system that sets a master chip as a first semiconductor chip and sets a plurality of slave chips as a plurality of second semiconductor chips.

Also, in another exemplary embodiment, an operation such as AUTO REFRESH or SELF REFRESH may also be applicable to each of the stacked slave chips.

The present invention may be applicable to any case that stacks a plurality of semiconductor chips in three dimension by using a TSV structure and identifies each of the stacked semiconductor chips. In particular, the present invention may also be applicable to a 3DS structure.

Also, the present invention may be applicable to any system that identifies a plurality of slave chips by using a first transmission line connected in series between a master chip and the slave chips and a second transmission line connected in parallel between the master chip and the slave chips.

As described above, the systems and the semiconductor devices for identifying the stacked chips and the methods thereof in accordance with the exemplary embodiments of the present invention can reduce an increase in the form factor according to the stacked chips and can improve the fabrication efficiency of the stacked chips, and thus the fabrication costs may be reduced.

Also, the systems and the semiconductor devices for identifying the stacked chips and the methods thereof in accordance with the exemplary embodiments of the present invention can control the stacked chips independently by identifying the stacked chips, and thus the performance of the stacked chips may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor system for identifying stacked chips, comprising:
a first semiconductor chip configured to generate a plurality of counter codes by using an internal clock or an external input clock and to transmit slave address signals and the plurality of counter codes through a through-chip via; and
a plurality of second semiconductor chips each configured to be given corresponding identifications (IDs) by separately latching a corresponding one of the plurality of counter codes transmitted from the first semiconductor chip, to compare the latched counter codes with the slave address signals, and to communicate data with the first semiconductor chip through the through-chip via according to the comparison result, wherein the first semiconductor chip comprises:
a slave controlling unit configured to generate the slave address signals by buffering/latching an address signal and a command signal in response to the external input clock:
an external clock generating unit configured to generate an external clock in response to the external input clock;
an internal clock generating unit configured to generate an internal clock in response to the external input clock;
a clock controlling unit configured to select one of the external clock and the internal clock, and to output the selected clock;
a clock driving unit configured to generate a driving clock for identifying the plurality of second semiconductor chips in response to the output clock of the clock controlling unit; and
a command controlling unit configured to generate a latch enable signal for identifying the plurality of second semiconductor chips in response to the driving clock and an enable signal, and to provide the latch enable signal to the clock driving unit and the plurality of second semiconductor chips.

2. The semiconductor system of claim 1, wherein the first semiconductor chip transmits a latch enable signal, which controls latching of the plurality of counter codes respectively at the plurality of second semiconductor chips, to an adjacent upper second semiconductor chip of the plurality of second semiconductor chip through a first transmission line connected in series between the first semiconductor chip and the plurality of second semiconductor chips through the through-chip via.

3. The semiconductor system of claim 2, wherein the first semiconductor chip transmits the plurality of counter codes, a plurality of command signals, and a driving clock, which is generated by dividing the frequency of the internal clock or the external input clock by a factor of 1/N, to the plurality of second semiconductor chips through second transmission lines connected in parallel between the first semiconductor chip and the plurality of second semiconductor chips through the through-chip via.

4. The semiconductor system of claim 3, wherein the plurality of command signals include a start signal, an end signal, and the slave address signals,
wherein the start signal has information indicating the start of identification of the plurality of second semiconductor chips,
the end signal has information indicating the completion of identification of the plurality of second semiconductor chips, and
the slave address signals are generated in synchronization with the internal clock or the external input clock by an address signal encoded to access the selected second semiconductor chip.

5. The semiconductor system of claim 4, wherein the start signal is used to generate a driving clock for identification of the plurality of second semiconductor chips by using the external input clock or the internal clock, and is transmitted to the plurality of second semiconductor chips to initialize the latched counter code.

6. The semiconductor system of claim 1, wherein the operation of giving the IDs to the plurality of second semiconductor chips is performed automatically upon completion of an external power applying operation and a reset operation, or is performed in response to an external command.

7. The semiconductor system of claim 1, wherein the first semiconductor chip processes the corresponding operation in a package state through programming by using a test mode and an electrical fuse.

8. The semiconductor system of claim 1, wherein the first semiconductor chip comprises:
a clock driving unit configured to generate a driving clock for identifying the plurality of second semiconductor chips in response to the external input clock; and
a command controlling unit configured to generate a latch enable signal for identifying the plurality of second semiconductor chips in response to the driving clock and an enable signal, and to provide the generated latch enable signal to the clock driving unit and the plurality of second semiconductor chips.

9. The semiconductor system of claim 1, wherein the slave controlling unit generates the slave address signals, which are used to select a slave chip, in synchronization with the external input clock by using the latched address/command signals, and provides the generated slave address signals to the plurality of second semiconductor chips.

10. The semiconductor system of claim 1, wherein the slave controlling unit comprises:
a latch block configured to generate a latched address signal by using the external input clock, the address signal, an inverted external input clock and an inverted address signal; and
a slave address signal generating block configured to receive the latched address signal from the latch block, to generate the slave address signals in synchronization with the external input clock in response to the command signal, and to provide the generated slave address signals to the plurality of second semiconductor chips.

11. The semiconductor system of claim 1, wherein the clock driving unit comprises:
a clock distributing unit configured to generate the driving clock by dividing the frequency of the output clock of the clock controlling unit by a factor of 1/N and to provide the generated driving clock to the command controlling unit and the plurality of second semiconductor chips; and
a clock counting unit configured to generate the plurality of counter codes by using the driving clock and the latch enable signal.

12. The semiconductor system of claim 4, wherein each of the plurality of second semiconductor chips comprises:
a slave command controlling unit configured to generate an upper latch enable signal for use in the upper second semiconductor chip and a latch signal and an inverted latch signal for latching the plurality of counter codes, by using the latch enable signal, the driving clock, the start signal and the end signal;
a slave latching unit configured to latch the plurality of counter codes in response to the latch signal and the inverted latch signal and to generate slave ID signals for use as an ID in each of the plurality of second semiconductor chips by using the latched counter codes; and
a slave comparing unit configured to compare the slave address signals for selecting the second semiconductor chip with the slave ID signals, and to generate a slave driving signal according to the comparison result.

13. The semiconductor system of claim 12, wherein the slave command controlling unit comprises:
    an upper latch enable signal generating block configured to generate the upper latch enable signal by using the latch enable signal, the driving clock, the start signal and the end signal, and to transmit the generated upper latch enable signal to the upper second semiconductor chip; and
    a latch generating block configured to generate the latch signal and the inverted latch signal by using the upper latch enable signal and the driving clock, and to provide the latch signal and the inverted latch signal to the slave latching unit.

14. The semiconductor system of claim 12, wherein the slave comparing unit comprises:
    a slave comparing block configured to compare the slave address signals with the slave ID signals and to output the comparison result; and
    a slave driving signal outputting block configured to generate the slave driving signal for driving a transmitter and a receiver of the corresponding second semiconductor chip when the slave address signals are consistent with the slave ID signals, and to provide the generated slave driving signal to the transmitter and the receiver of the corresponding second semiconductor chip to communicate data between the first semiconductor chip and the corresponding second semiconductor chip.

15. The semiconductor system of claim 4, wherein each of the second semiconductor chips comprises:
    a slave fuse unit configured to generate slave fuse signals for bypassing defective chips of the semiconductor chips and preventing transmission of information about the corresponding chips;
    a slave command controlling unit configured to generate an upper latch enable signal for use in the upper second semiconductor chip and an inverted latch signal and a latch signal for latching the counter codes, by using the latch enable signal, the driving clock, the start signal, the end signal, and the slave fuse signals;
    a slave latching unit configured to latch the counter codes in response to the latch signal and the inverted latch signal and to generate slave ID signals for use as an ID in each of the second semiconductor chips by using the latched counter codes;
    a slave selecting unit configured to selectively output the slave fuse signals and slave ID signals as slave selection signals; and
    a slave comparing unit configured to compare the slave address signals for selecting the second semiconductor chip with the slave selection signals, and to generate a slave driving signal according to the comparison result.

16. The semiconductor system of claim 15, wherein the slave fuse unit is driven by an electrical fuse or programming, and provides the generated slave fuse signals to the slave command controlling unit, the slave selecting unit and the slave comparing unit to control the slave command controlling unit, the slave selecting unit and the slave comparing unit.

17. The semiconductor system of claim 15, wherein if the slave selection signals are equal to the slave address signals, the slave comparing unit generates the slave driving signal for driving a transmitter and a receiver of the corresponding second semiconductor chip and provides the generated slave driving signal to the transmitter and the receiver of the corresponding second semiconductor chip to communicate data between the first semiconductor chip and the corresponding second semiconductor chip.

18. A semiconductor device for identifying stacked chips, comprising:
    a master chip configured to generate a plurality of counter codes by using an internal clock or an external input clock and to transmit slave address signals and the plurality of counter codes through a through-chip via; and
    a plurality of slave chips each configured to be given independent identifications (IDs) by separately latching a corresponding one of the plurality of counter codes transmitted from the master chip,
    wherein the plurality of counter codes are generated corresponding to the plurality of slave chips, and
    wherein the master chip comprises:
        a slave controlling unit configured to receive the external input clock, an address signal and a command signal from an external device and to buffer/latch the address signal and the command signal in response to the external input clock;
        a clock driving unit configured to generate a driving clock for identifying the plurality of slave chips in response to the external input clock;
        a command controlling unit configured to generate a latch enable signal for identifying the plurality of slave chips in response to the driving clock and an enable signal, and to provide the generated latch enable signal to the clock driving unit and the plurality of slave chips;
        an external clock generating unit configured to receive the external input clock and to generate an external clock by using the external input clock;
        an internal clock generating unit configured to receive the external input clock and to generate an internal clock by using the external input clock; and
        a clock controlling unit configured to select one of the external clock and internal clock, and output the selected clock as the external input clock of the clock driving unit.

19. The semiconductor device of claim 18, wherein the plurality of slave chips latch the plurality of counter codes, compare the latched counter codes with the slave address signal received from the master chip, and communicates data with the master chip if the latched counter codes are equal to the slave address signal.

20. The semiconductor device of claim 18, wherein the master chip transmits a latch enable signal, which is to latch the plurality of counter codes respectively at the plurality of slave chips, to the slave chip through a first transmission line connected in series between the master chip and the plurality of slave chips through the through-chip via.

21. The semiconductor device of claim 18, wherein the master chip transmits the plurality of counter codes, a plurality of command signals, and a driving clock, which is generated by dividing the frequency of the internal clock or the external input clock by a factor of 1/N, to the plurality of slave chips through second transmission lines connected in parallel between the master chip and the plurality of slave chips through the through-chip via.

22. The semiconductor device of claim 21, wherein the plurality of command signals include a start signal, an end signal, and the slave address signals,
    the start signal has information indicating the start of identification of the plurality of slave chips,
    the end signal has information indicating the completion of identification of the plurality of slave chips, and
    the slave address signals are generated in synchronization with the internal clock or the external input clock by an address signal encoded to access the selected slave chip.

23. The semiconductor device of claim 22, wherein the start signal controls the external input clock or the internal clock to generate a driving clock for identification of the plurality of slave chips, and is transmitted to the plurality of slave chips to initialize the latched counter code.

24. A system for identifying stacked chips, comprising:
a master chip of stacked chips configured to generate a plurality of counter codes corresponding to a plurality of stacked chips and to generate a first latch enable signal; and
a first slave chip of the stacked chips configured to latch a corresponding one of the plurality of counter codes transmitted from the master chip through a through-chip via in response to a second latch enable signal generated in the first slave chip by using the first latch enable signal; and
a second slave chip of the stacked chips configured to latch a corresponding one of the plurality of counter codes transmitted from the master chip through the through-chip via in response to a third latch enable signal generated in the second slave chip by using the second latch enable signal,
wherein the first and second slave chips are indentified by the corresponding counter codes, respectively,
wherein the master chip comprises:
a slave controlling unit configured to generate slave address signals by buffering/latching an address signal and a command signal in response to an external input clock;
an external clock generating unit configured to generate an external clock in response to the external input clock;
an internal clock generating unit configured to generate an internal clock in response to the external input clock;
a clock controlling unit configured to select one of the external clock and the internal clock, and to output a selected clock;
a clock driving unit configured to generate a driving clock for identifying the first and second slave chips in response to the output clock of the clock controlling unit; and
a command controlling unit configured to generate a latch enable signal for identifying the first and second slave chips in response to the driving clock and an enable signal, and to provide the latch enable signal to the clock driving unit and the first and second slave chips.

* * * * *